(12) United States Patent
Cho et al.

(10) Patent No.: US 6,835,468 B2
(45) Date of Patent: Dec. 28, 2004

(54) FLUORENE BASED POLYMERS AND LIGHT EMITTING DIODES FABRICATED WITH THE SAME AS LIGHT EMITTING MATERIAL

(75) Inventors: Hyun Nam Cho, Seoul (KR); Young Chul Kim, Seoul (KR); Jae-Min Hong, Seoul (KR); Jong-Bok Kim, Seoul (KR); Doo Kyung Moon, Taejon (KR); Young Sei Park, Taejon (KR); Ho Seong Nam, Taejon (KR)

(73) Assignees: Korea Institute of Science and Technology (KIST), Seoul (KR); Hanwha Chemical Corporation, Seoul (KR)

( * ) Notice: Subject to any disclaimer, the term of this patent is extended or adjusted under 35 U.S.C. 154(b) by 0 days.

(21) Appl. No.: 09/947,208

(22) Filed: Sep. 4, 2001

(65) Prior Publication Data

US 2002/0051895 A1 May 2, 2002

(30) Foreign Application Priority Data

Sep. 5, 2000 (KR) ........................................ 2000/52400

(51) Int. Cl.$^7$ ........................ H05B 33/14; C09K 11/06; C08F 38/00; C08G 61/00
(52) U.S. Cl. ...................... 428/690; 428/917; 313/504; 313/506; 257/40; 257/103; 526/239; 526/259; 526/270; 526/280; 526/285; 526/286; 528/397
(58) Field of Search ................................ 428/690, 917; 313/504, 506; 257/40, 103; 252/301.16, 301.35; 526/239, 259, 270, 280, 285, 286; 528/397

(56) References Cited

U.S. PATENT DOCUMENTS

| | | | | |
|---|---|---|---|---|
| 5,807,974 A | * | 9/1998 | Kim et al. ................... | 528/366 |
| 5,876,864 A | * | 3/1999 | Kim et al. ................... | 428/690 |
| 6,169,163 B1 | * | 1/2001 | Woo et al. ................... | 528/397 |
| 6,232,001 B1 | * | 5/2001 | Igarashi ...................... | 428/690 |
| 6,344,286 B1 | * | 2/2002 | Kim et al. ................... | 428/690 |

OTHER PUBLICATIONS

Anne Donat–Bouillud et al., "Light–Emitting Diodes from Fluorene–Based π–Conjugated Polymers", Chem. Mater. 2000, 12, pp. 1931–1936 (published on Web Jun. 20, 2000).*
J. B. Kim et al., "Novel fluorene–based polymers containing acetylene units", Synthetic Metals 119, pp. 105–106, Mar. 2001.*
Weder, et al.; "Incorporation of Photoluminescent Polarizers into Liquid Crystal Displays"; SCIENCE, vol. 279, Feb. 6, 1998, pp. 835–837.
Grem, et al.; "Realization of a Blue–Light–Emitting Device using Poly(p–phenylene)"; Advanced Materials, 4, 1992, pp. 36–37, no month.
Yoshino, et al; "Gel chromism and anomalous luminescence in poly(3–alkylthiophene)"; Synthetic Materials, 49–50, 1992 pp. 491–497, no month.
Zhang, et al; "Blue electroluminescent diodes utilizing blends of poly(p–phenylphenylene vinylene) in poly(9–vinylcarbazole)"; Synthetic Metals, 62, 1994, pp. 35–40, no month.
Moroni, et al.; "Rigid Rod Conjugated Polymers for Nonlinear Optics. 1. Characterization and Linear Optical Properties of Poly(aryleneethynylene) Derivatives"; MACROMOLECULES 1994, 27, pp. 562–571, no month.
Andersson, et al.; "Electroluminescence from Substituted Poly(thiophenese): From Blue to Near–Infrared"; MACROMOLECULES 1995, 28, pp. 7525–7529, no month.
Weder et al.; "Efficient Solid–State Photoluminescence in New Poly(2,5–dialkoxy–p–phenyleneethynylene)s"; MACROMOLECULES 1996, 29, pp. 5157–5165, no month.
Davey et al.; "New Rigid Backbone Conjugated Organic Polymers with Large Fluorescence Quantum Yields"; J. Chem. Soc., Chem Commun., 1995, pp. 1433–1434, no month.
Bunten et al.; "Synthesis, Optical Absorption, Fluorescence, Quantum Efficiency, and Electrical Conductivity Studies of Pyridine/Pyridinium Dialkynyl Organic and PT(II)–0–Acteylide Monomers and Polymers"; MACROMOLECULES 1996, 29, pp. 2885–2893, no month.
Giesa et al.; "Soluble poly(1,4–phenyleneethynylene)s"; Makromol. Chem. 191, pp. 857–867, 1990, no month.

* cited by examiner

Primary Examiner—Marie Yamnitzky
(74) Attorney, Agent, or Firm—Darby & Darby (57) ABSTRACT

A fluorene-based polymer of the following Formula (I) and electroluminescent devices using the same.

Formula (I)

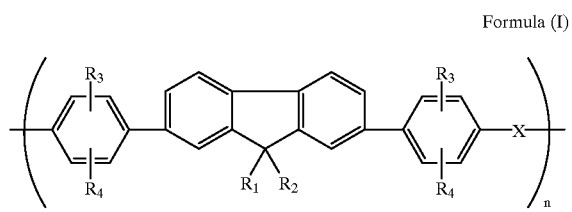

wherein, $R_1$, $R_2$, $R_3$ and $R_4$ are same or different and represent hydrogen, aliphatic or alicyclic alkyl or alkoxy groups containing 1 to 22 carbon atoms, aryl or aryloxy group containing 6 to 18 carbon atoms, cyano, cyanoethyl, or an alkyl or aryl derivative of silicon, tin or germanium;

X represents diacetylene, diethynyl aryl, divinylaryl group or a single bond; and n is an integer equal to or greater than 1.

12 Claims, 6 Drawing Sheets

FLUORENE BASED POLYMERS AND LIGHT EMITTING DIODES FABRICATED WITH THE SAME AS LIGHT EMITTING MATERIAL

BACKGROUND OF THE INVENTION

1. Field of the Invention

The present invention relates to fluorene-based alternating polymers and electroluminescence (hereinafter as EL) devices using the same and more particularly, to fluorene-based alternating polymers having a chemical Formula 1, which can be used as an organic photoelectron materials, particularly, EL materials and to EL devices containing the same as an emitting layer.

2. Description of the Background Art

Poly(phenylene vinylene) (PPV), polythiophene (PTh) and polyphenylene-based macromolecules (Synth. Met. 50(1–3), p.491 (1992) and Adv. Mater., 4, p. 36 (1992)), are known as representative macromolecular luminescent materials which have been currently studied, but these materials have the disadvantage that the final material is insoluble in any organic solvent. Such materials may exhibit an improved processability by appropriate substituents introduced therein. Although PPV and PTh derivatives (Synth. Met., 62, p.35 (1994), Adv. Mater., 4, p.36 (1994), and Macromolecules, 28, p. 7525 (1995)), which emit diverse lights of blue, green and red colors, are known but the manufacturing process of such derivatives is very complicated, and they also exhibit problems in stability. Moreover, fluorene-based macromolecules which emit blue light (Jpn. J. Appl. Phys., 30, p.L1941 (1991)) have been reported but have disadvantages in that they cannot exhibit other various colors, and require the use of a manufacturing method, but by which macromolecules with more diversified conjugate double bonds cannot be made. The inventors of this application disclosed a fluorene-based alternating copolymer for an electroluminescence device having a conjugate double bond, which overcomes the above-described problems, in Korean Patent Application No. 176336 and U.S. patent application Ser. No. 5,807,974. Meanwhile, macromolecules containing an acetylene group are disclosed in Makromol Chem. 191, p. 857 (1990), Macromolecules, 27, p 562 (1994), J. Chem. Soc., Chem. Commun., p 1433, (1995) and Macromolecules, 29, p 5157 (1996). However, these materials have been researched for applications for a non-linear optical material, an optical conductivity, and a photoluminescence (hereinafter, referred to as PL) (Science, 279, p.835 (1998)). Recently, the present inventors have also proposed macromolecules containing acetylene groups, which are adapted for applications for LEDs, in U.S. patent application Ser. No. 5,876,864. Polymers having diacetylene groups have also been proposed (PROG. POLYM. Sci., 20, p.943 (1995), CHEMTECH, October, p.32 (1993) and Macromolecules, 29, p.2885 (1996)). Since such polymers having diacetylene groups are more sensitive to heat or light, cross linking reaction occurs therein easily. Such polymers are mainly applicable to non-linear optical materials, heat resistant macromolecules, polarized PL macromolecules, and electrically and optically active macromolecules. However, there is no application of such polymers to EL materials.

SUMMARY OF THE INVENTION

The present inventors have invented the present invention as a result of their active research to manufacture diverse kinds of macromolecular EL materials which require only a simple manufacturing method while exhibiting a definite structure in the final substance thereof and the materials being well soluble in any organic solvent.

Namely, the present invention is directed to using a polymer containing an acetylene group, as expressed by the following Formula (I), to fabricate a macromolecular EL device. Since this polymer has an optical and electrical activity, thereby exhibiting PL characteristics, non-linear optical characteristics, and optical and electrical conductivity, it is expected that the polymer is applicable to photo switches, modules, waveguides, transistors, laser and light absorbers, and macromolecular separating membranes, all of which utilize those characteristics, in addition to applications to EL devices, in particular, LEDs, as mentioned above.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Formula (I)

wherein, $R_1$, $R_2$, $R_3$ and $R_4$ are same or different and represent hydrogen, aliphatic or alicyclic alkyl or alkoxy groups containing 1 to 22 carbon atoms, aryl or aryloxy group containing 6 to 18 carbon atoms. For example, $R_1$, or $R_2$ represents hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxy- ethoxyethyl, phenyl, phenoxy, tolyl, benzyl, naphthyl, anthracene, cyano or cyanoethyl groups. $R_1$ or $R_2$ also represent alkyl or aryl derivatives of silicon, tin or germanium such as trimethylsilyl, triphenylsilyl, tributyltin, or triethylgermanium.

X represents diacetylene, diethynyl aryl, divinylaryl group or any group which as a single bond. Preferably X is selected from the group consisting of the following:

wherein nil means a direct bonding. For example, it means a direct bonding without going through acetylene or any double bond (in other words, attached by a single bond); and Ar represents a compound having a phenyl group having one or two substituents in he ortho, meta and/or para position, a compound having at least two phenyl groups selected from flourine, diphenyl, terphenyl, naphthalene, anthracene, phenanthrene and their derivatives, a compound having hetero atoms selected from pyridine, furan, thiophene, pyrrole, dibenzofuran, dibenzothiophene, diphenyoxadiazole, diphenyithiadiazole, cabazole, stilbene and their derivatives, a diphenylmethane or diphenylsilane compound, and bisphenoxyalkane or bisphenoxyalkoxy compound. Also. R1 and $R_2$ have the same definition as aforementioned. n is an integer from 1.

Preferred Embodiments of Ar Include:

The polymerization degree and the manufacturing method of the polymers used in the present invention need not be particularly restricted. For instance, since such polymers are soluble in any organic solvent, the polymerization degree is generally 1 to 2,000, and preferably 3 to 1,000, to the extent that a film is formed by a spin coating or casting method. As a method for preparing a polymer having two triple bonds as represented by Formula (I), a well-known method may be used in which oxygen is introduced into an acetylene compound in the presence of copper chloride, thereby causing it to react with the acetylene compound as expressed by the following reaction scheme (i) (Prog. Polym. Sci., 20., 20, p.943 (1995), Macromolecules, 29, p.2885 (1996)). More specifically, the preparation of the polymer with the acetylene compound can be achieved by carrying out a polymerization of acetylene, using CuCl or Cu(OAc)$_2$, which is a monovalent or divalent copper compound, and pyridine or amine compound such as tetramethylethylenediamine (TMEDA) as a base, in a solvent such as o-dichlorobenzene, chlorobenzene or pyridine, while bubbling oxygen. Reaction Schemes (i) to (vi) show various preparation and polymerization procedures with the acetylene compound, and the structural Formulas of the compounds involved. Reaction Schemes (i) to (iii) illustrate exemplified homopolymerizations of a monomer, such as diethynylfluorene(M-2), 2,7-bis(para-propargyloxystyryl)-9,9'-di-N-hexyl fluorene(M-9), 3,6-bis(para-propargyloxystyryl)-di-N-hexyl-carbazole (M-10), 1,4-bis(para-propargyloxystyryl)-2,5-di-N-hexyloxybenzene, or the like. Reaction Schemes (v) to (vi) show exemplified copolymerizations of the monomer with other compound(s). Here, at least one monomer of the present invention and copolymers by copolymerization with the derivatives or more mutual polymerization are included in the present invention.

Reaction Scheme i

-continued

Scheme ii (C-3)

In Reaction Schemes (i) to (vi), $R_1$, $R_2$ and n have the same definition as above and m is an integer equal or greater than 1.

In the Reaction Schemes (i) to (vi), $R_1$ and $R_2$ represent n-hexyl group, n-dodecyl and/or n-hexadecyl and cyanoethyl group and they will be described in Examples in detail.

As an example of methods for manufacturing the synthesis havin a triple bond, double bond or a single bond, there is a typical method using a reaction of acetylene compounds and halogen compounds by a palladium catalyst. As palladium catalyst, $Pd(PPh_3)_4$, or $Pd(PPh_3)_2Cl_2$ is used and amine compounds such as triethylamine, triisopropylamine or piperidine are reacted with CuI in solutions of THF or DMF. In the present invention, diethynyl phenylfluorene and the derivatives as acetylene compounds for which 2 or more halogen, they are chlorine, bromine or iodine are substituted as halogen compound can be used. All diethynyl fluorene compounds and aromatic halogen comp unds which can form the chemical Formula 1 after polymerization are included. Also manufacturing macromolecules having a double bond can be done by the Heck polymeriz g method of reacting dihalogen compounds and divinyl compounds in the presence of a nickel catalyst. Dihalogen compounds can obtain macromolec les having single bonds.

Meanwhile, the luminescent polymer having a diacetylene group in accordance with the present invention may be directly used for a luminescent material. Alternatively, it may be used after being cross-linked by direct heating or by irradiation with light such as ultraviolet rays or electron beams. In the most typical structure of an EL device, to which the present invention is applied, the materials of the present invention, which serves as a luminescent layer, is interposed between an anode and cathode of an EL device. The present invention is not limited to such a structure. For example, the materials of the present invention may also be used along with a hole transfer layer or electron transfer layer, as disclosed in Japanese Patent Publication Nos. 2-135361, 3-152184 and 6-207170.

That is, a structure of anode/hole transfer layer/luminescent layer/electron transfer layer/cathode may be implemented. The anode may be comprised of a transparent support substrate made of glass, transparent plastic, or quartz, etc. and coated with a metal or metallic oxide, such as ITO, gold, copper, tin oxide, or zinc oxide, or an organic semiconductor compound such as polypyrrole, polyaniline or polythiophene to a thickness of 10 nanometer to 1 micron. The cathode may be made of metal, such as sodium, magnesium, calcium, aluminum, indium, silver, gold, or copper, or an alloy thereof. Each of the hole transfer layer and electron transfer layer may be formed using a known compound in accordance with which are formed in the form of a thin film in accordance with a known thin film formation method such as a vacuum deposition method, a spin coating method, a casting method, or a LB method. The hole transfer layer may be made of polyvinylcarbazole, 2,5-bis-(4'-diethylaminophenyl)-1,3,4-oxadizole, or N,N'-diphenyl-N, N'-(3-methylphenyl)-1,1'-bi-phenyl-4,4'-diamine (TPD). The electron transfer layer may be made of tris(8-hydroxyquinolinato) aluminum, 2-(4'-tert-butylphenyl)-5-(4"-bi-phenyl)-1,3,4-oxadiazole or 2,4,7-trinitro-9-fluorenone. In addition, the luminescent polymers according to the present invention may be blended with the material of the hole transfer layer or electron transfer layer, or another known luminescent polymer, different from the polymer of the present invention, such as a soluble PPV or PTh derivative. For example, macromolecules having a diacetylene group according to the present invention are dissolved in an organic solvent, such as chloroform, along with polyvinylcarbazole, poly(1,4-hexyloxy-2,5-phenylenvinylene) or poly(3-hexylthiophene). Using the resultant material, a thin film is formed in accordance with the spin coating method or the casting method. In this case, the luminescent macromolecules of the present invention are used in concentration of 0.001~99 weight % based on the weight of the polyvinylcarbazole, and preferably 0.1~50 weight %. The thin film has a thickness of 5 nanometer to 5 micron, and preferably 50 nanometer to 1 micron. The macromolecules of the present invention may also be blended with macromolecules which are different from the materials of the hole transfer layer or electron transfer layer, but can be dissolved in a general organic solvent, thereby being capable of forming a thin film. In this case, the concentration of the macromolecules of the present invention and the thickness of the thin film are defined within the above ranges, respectively. For example, the macromolecules usable along with the macromolecules of the present invention include thermoplastic resin such as polyvinylcarbazole, polymethylmethacrylate, polyarcylate, polystyrene, polycarbonate, polyvinylchloride, polyethylene, polypropylene, polyacrylonitrile, polyvinylpyrrolidone, polyvinylalcohol, polyvinylacetate, polyvinylbutyral, polyvinylamine, polycaprolacton, polyethylentherephthalate, polybutylentherephthalate, polyurethane, acrylonitrilestyrenebutadiene (ABS), polysulfone, or polyvinylfluoride, etc., or resins for general use, such as acetal, polyamides, polyimides, polyester, alkyd, urea, furan, nylon, melamine, phenol, silicone, or epoxy of the present invention.

The present invention is described more specifically by Examples which by no means limit the present invention.

EXAMPLES

Synthesis of Monomers

Monomers to be used in the present invention are not required to be particularly restricted. For example, any monomers may be used as long as the polymer formed after polymerization of those monomers satisfies Formula (I). Even though it is not specifically mentioned in the following description, compounds that can be easily synthesized in general, that are already well known or which are similar to the well-known compounds, or commercially available monomers may be synthesized employing well-known methods or similar methods so that the resultant material is used to manufacture the polymer of the present invention. The synthesized material may also be commercially available.

Example 1

Synthesis of 2,7-diphenyl -9,9'-di-n-hexylfluorene (M-1)

In a 1 liter four-neck flask equipped with a thermometer, mechanical stirrer and a reflux condenser, 100 g (0.2 mol) of 2,7-dibromo-9,9'-di-n-hexyl fluorene, 56.93 g (0.467 mol) of benzeneboronic acid and 2.53 g (2.03 mmol) of tetreakistriphenylphosphine palladium were dissolved in 500 ml toluene under nitrogen atmosphere. 250 ml of 2M sodium carbonate was then slowly added dropwise into the resultant solution and when the addition was finished, a circulation was performed for the solution for forty eight hours while the reaction temperature was slowly increased. When the reaction was finished, the resultant solution was cooled to room temperature, extracted three times with benzene and then washed by water several times. Then the resultant solution was dried using anhydrous magnesium sulfate and the solvent was removed under vacuum condition thus to form a dark brown solid. The resultant materials were purified in the mixed solution of hexane/methylene chloride (9:1) with silica gel column. Thereafter, the resultant materials were filtered, thus to remove the solvent and to obtain a milky viscous oil. The obtained material was re-crytsallized twice using hexane, thus obtaining pure milky crystals. The thusly obtained crystals were fully dried in a vacuum oven maintained at a temperature of 30° C. to obtain 82 g (82.9% yield) of the title product. The melting point was 65 to 66° C. 1H-NMR CDCl$_3$) d 0.71–1.06 (m, 22H, CH$_2$, CH$_3$), 2.03–2.17 (m, 4H, CCH$_2$), 7.34–7.78 (m, 16H, aromatic).

Example 2

Synthesis of 2,7-diphenyl-(4-bromophenyl)-9,9'-di-normal-hexyl fluorene (M-2)

In a 1 liter three-neck flask equipped with a stirrer, a thermometer and a reflux condenser, 50 g (0.1 mol) of 2,7-diphenyl-9,9'-di-normal-hexyl fluorene was dissolved in 400 ml of methylene chloride and the resultant solution was cooled to −5° C. in ice water. 33.56 g (0.21 mol) of bromine which was diluted in 100 ml of methylene chloride was then slowly added dropwise into the resultant solution. When the addition of the same was finished, a reaction was performed for the solution for twenty four hours while the temperature is kept at 25° C. When the reaction was finished, 20% potassium hydroxide was poured to the resultant solution and separated the organic layer and it was washed by water several times. Then the resultant materials were dried using anhydrous magnesium sulfate. After filtering it, when the solvent was removed a viscous liquid was obtained. After dissolving the liquid in hexane, when it is frozen to −40° C. a solid was obtained. After re-crystallization twice using hexane, pure white crystal was obtained. The obtained crystals were filtered and dried in a vacuum oven maintained at a temperature of 30° C. to obtain the 55 g (yield 83. 66%) of the titled product. The melting point was 121 to 123° C. $^1$H-NMR (CDCl$_3$) δ 0.71–1.06 (m, 22H, CH$_2$, CH$_3$), 1.99–2.06 (m, 4H, CCH$_2$), 7.45–7.78 (m, 16H, Aromatic).

Example 3

Synthesis of 2,7-bis[4-((trimethylsilyl)ethynyl) phenyl]-9,9'-di-n-hexyl fluorene (M-3)

In a 1 liter three-neck flask equipped with a stirrer, a thermometer and a reflux condenser, 20 g (0.031 mol) of 2,7-bis(4-bromophenyl)-9,9'-di-n-hexyl fluorene, 1.08 g (5 mmol) of bistriphenylphosphine palladium dichloride [(PPh$_3$)$_2$PdCl$_2$] and 0.295 g (5 mmol) of cuprous iodide (CuI) were dissolved in 200 ml of diisoprophylamine under nitrogen atmosphere. 7 g (0.071 mol) of trimethylsilyl acetylene was then slowly added dropwise into the resultant solution at room temperature. When the addition of the same was finished, a circulation was performed for the solution for three hours while the reaction temperature was slowly increased to 70 to 80° C. When the reaction was finished, the resultant solution was cooled to room temperature, extracted three times with ether and then was washed by water several times. Then the resultant materials were dried using anhydrous magnesium sulfate and the solvent was removed under vacuum condition thus to form a dark brown viscous oil. The resultant materials were purified using silica gel column in a solvent mixture of hexane/methylenechloride (10:1). Thereafter, the resultant materials were filtered, thus to remove the solvent and to obtain a milky viscous oil. The obtained material was re-crystallized twice using hexane and ethanol, thus obtaining pure milky crystals. The obtained crystals were fully dried in a vacuum oven maintained at a temperature of 30° C. to obtain 16.25 g (81% yield) of the titled product. The melting point was 118 to 129° C. $^1$H-NMR (CDCl$_3$) δ 0.29 (s, 18H, SiCH$_3$), 0.72–1.06 (m, 22H, CH$_2$, CH$_3$), 2.00–2.04 (m, 4H, CCH$_2$), 7.49–7.71 (m, 14H, Aromatic).

Example 4

Synthesis of 2,7-bis(4-ethynyl phenyl)-9,9'-di-n-hexyl fluorene (M-4)

In a 250 milliliter flask equipped with a stirrer and a thermometer, 4 g (5.8 mmol) of 2,7-bis[4-((trimethylsilyl) ethynyl)phenyl]-9,9'-di-n-hexyl fluorene, and 6 ml of 20% by weight of potassium fluoride were dissolved in 100 ml of methanol. Then a reaction was performed for the solution for six hours at room temperature. When the reaction was finished, 50 ml of methanol is added to the resultant solution and the solvent was removed under vacuum condition. The remaining materials were then extracted three times with ether and then washed by water several times. Subsequently, the resultant materials were dried using anhydrous magnesium sulfate and the solvent was removed under vacuum condition. Thereafter, the resultant materials were purified using silica gel column in a solvent mixture of hexane/methylene chloride (4:1) and re-crystallized using hexane to obtain 2.82 g (90% yield) of the titled compound. The melting point was 101 to 102° C. $^1$H-NMR (CDCl$_3$) δ 0.78–1.42 (m, 22H, CH$_2$, CH$_3$), 2.02–2.1(m, 4H, CCH$_2$), 3.19(s, 2H, CH), 7.42–7.78 (m, 14H, Aromatic).

Example 5

Synthesis of 2,7-diphenyl-9,9'-di-n-dodecyl fluorene (M-5)

The procedure of Example 1 was repeated, except that 60 g (0.09 mol) of 2,7-dibromo-9,9'-di-n-dodecyl fluorene was used to obtain 55.66 g (93.6% yield) of the titled product as a pure ivory-colored solid. The melting point was 44 to 45° C. $^1$H-NMR (CDCl$_3$) δ 0.78–1.25 (m, 46H, CH$_2$, CH$_3$), 2.06–2.1(m, 4H, CCH$_2$), 7.41–7.78 (m, 16H, Aromatic).

Example 6

Synthesis of 2,7-bis(4-bromophenyl)-9,9'-di-normal-dodecyl fluorene (M-6)

The procedure of Example 2 was repeated, except that 20 g (0.03 mol) of 2,7-diphenyl-9,9'-di-n-dodecyl fluorene was used. By the re-crystallization with hexane and ethanol (1:1), 20.35 g (81.9% yield) of the entitled product was obtained as a pure ivory-colored solid while having a melting point of 83 to 84° C. $^1$H-NMR (CDCl$_3$) δ 0.68–1.19 (m, 40H, CH$_2$, 6H, CH$_3$), 1.98–2.06 (m, 4H, CCH$_2$), 7.51–7.79 (m, 16H, Aromatic).

Example 7

Synthesis of 2,7-bis[4-((trimethylsilyl)ethynyl) phenyl]-9,9'-di-n-dodecyl fluorene (M-7)

The procedure of Example 3 was repeated, except that 10 g (0.012 mol) of 2,7-bis(4-bromophenyl)-9,9'-di-n-dodecyl fluorene was used. By a re-crystallization with a small amount of hexane and excess amount of ethanol, 8.5 g (8.15% yield) of the entitled compound was obtained as a pure ivory-colored solid. The melting point was 75 to 86° C. $^1$H-NMR (CDCl$_3$) δ 0.25 (s, 18H, SiCH$_3$), 0.6–1.31 (m, 40H, CH$_2$, 6H, CH$_3$), 1.94–2.12 (m, 4H, CCH$_2$), 7.50–7.78 (m, 14H, Aromatic).

Example 8

Synthesis of 2,7-bis(4-ethynyl phenyl)-9,9'-di-n-dodecyl fluorene (M-8)

The procedure of Example 4 was repeated, except that 5 g (5.9 mmol) of 2,7-bis[4-((trimethylsilyl)ethynyl)phenyl]-9,9'-di-n-dodecyl fluorene was used. By a re-crystallization using a small amount of hexane and excess amount of ethanol, 4.14 g (96% yield) of the entitled compound was obtained as a pale-yellow solid material. The melting point was 42 to 43° C. $^1$H-NMR (CDCl$_3$) δ 0.71–1.22 (m, 40H, CH$_2$, 6H, CH$_3$), 2.02–2.18 (m, 4H, CCH$_2$), 3.18 (s, 2H, CH), 7.59–7.84 (m, 14H, Aromatic).

Example 9

Synthesis of 2,7-diphenyl-9,9'-di-n-hexadecyl fluorene (M-9)

The procedure of Example 1 was repeated, except that 25 g (0.03 mol) of 2,7-dibromo-9,9'-di-n-hexadecyl fluorene was used. 21.67 g (87,8% yield) of the entitled product was obtained as a pure ivory-colored solid material. The melting point was 65 to 66° C. $^1$H-NMR (CDCl$_3$) δ 0.78–1.25 (m, 56H, CH$_2$, 6H, CH$_3$) 1.99–2.08 (m, 4H, CCH$_2$), 7.26–7.80 (m, 16H, Aromatic).

Example 10

Synthesis of 2,7-bis(4-bromophenyl)-9,9'-di-n-hexadecyl fluorene (M-10)

The procedure of Example 2 was repeated, except that 15 g (0.019 mol) of 2,7-diphenyl-9,9'-di-n-hexadecyl fluorene was used. By a re-crystallization with hexane and ethanol (1:1), 15.36 g (84.4% yield) of the entitled product was obtained as a pure ivory-colored solid material, The melting point was 85 to 86° C. $^1$H-NMR (CDCl$_3$) δ 0.68–1.23 (m, 56H, CH$_2$, 6H, CH$_3$), 1.98–2.04 (m, 4H, CCH$_2$), 7.51–7.79 (m, 16H, Aromatic).

Example 11

Synthesis of 2,7-bis[4-((trimethylsilyl)ethynyl)phenyl]-9,9'-di-n-hexadecyl fluorene (M-11)

The procedure of Example 3 was repeated, except that 10 g (0.012 mol) of 2,7-bis(4-bromophenyl)-9,9'-di-n-hexadecyl fluorene was used. By a re-crystallization with a small amount of hexane and excess amount of ethanol, 8.5 g (81.5% yield) of the entitled product was obtained as a pure ivory-colored solid material. The melting point was 75 to 76° C. $^1$H-NMR (CDCl$_3$) δ 0.25 (s, 18H, SiCH$_3$), 0.6–1.31 (m, 56H, CH$_2$, 6H, CH$_3$), 1.94–2.12 (m, 4H, CCH$_2$), 7.51–7.78 (m, 14H, Aromatic).

Example 12

Synthesis of 2,7-bis(4-ethynyl phenyl)-9,9'-di-n-hexadecyl fluorene (M-12)

The procedure of Example 4 was repeated, except that 5 g (5.2 mmol) of 2,7-bis[4-((trimethylsilyl)ethynyl)phenyl]-9,9'-di-n-hexadecyl fluorene was used. By a re-crystallization with a small amount of hexane and excess amount of ethanol, 3.9 g (91.5% yield) of the entitled product was obtained as a pale yellowish solid material. The melting point was 60 to 61° C. $^1$H-NMR (CDCl$_3$) δ 0.60–1.31 (m, 40H, CH$_2$, 6H, CH$_3$), 1.98–2.08 (m, 4H, CCH$_2$), 3.12 (s, 2H, CH), 7.39–7.80 (m, 14H, Aromatic).

Example 13

Synthesis of 9-n-hexyl fluorene (M-13)

In a 2 liter three-neck flask equipped with a stirrer and a thermometer, 100 g (0.6 mol) of fluorene was dissolved in 1 l of tetrahydrofuran and the flask was cooled sufficiently to –78° C. With an injector, 264 ml (1.32 mol) of 2.5M n-butyl lithium which was diluted in hexane was slowly added dropwise into the flask. When the addition of the same was finished, the above cooled temperature was maintained for thirty minutes, and then the flask was stirred at room temperature for one hour. Then again the resultant material was cooled down to –78° C. 88.44 ml (1.26 mol) of hexyl bromide was added into the flask using an injector. When the above procedure was finished, after keeping the temperature for thirty minutes, the flask was stirred at room temperature for 24 hours. When the reaction was finished, a small amount of cooled distilled water was poured to the resultant solution and the resultant solution was stirred for 2 to 3 minutes. When layers were separated, the organic layer was extracted using ether three times and it was washed by water several times. Then the resultant materials were dried using anhydrous magnesium sulfate and after removing the solvent, the resultant materials were purified with column, to obtain 132 g (88% t yield) of the entitled product as a pale yellowish viscous oil. $^1$H-NMR (CDCl$_3$) δ 0.6–1.41 (m, 8H, CH$_2$, 3H, CH$_3$), 2.08–2.12 (m, 4H, CCH$_2$), 4.07–4.18 (t, 1H, CH), 7.39–7.92 (m, 8H, Aromatic).

Example 14

Synthesis of 9-n-hexyl-9'-(2-cyanoethyl) fluorene (M-14)

In a 1 liter three-neck flask equipped with a stirrer, a thermometer and a reflux condenser, 100 g (0.4 mol) of 9-n-hexyl fluorene was dissolved in 400 ml of 1,4-dioxan. 3.05 g (8 mmol) of benzyltrimethylammonium hydroxide was then added dropwise into the resultant solution using an injector and warmed up in a water double boiler. Then 27.591 g (0.52 mol) of acrylonitrate which was diluted in 20 ml of 1,4-dioxane was slowly added dropwise into the resultant solution. Since the reaction was an exothermic reaction, the temperature was kept at 30 to 40° C. After procedure was finished, the resultant solution was stirred for twelve hours. When the reaction was finished, the resultant solution was extracted three times with ether, washed by water several times and dried using anhydrous magnesium sulfate. After filtering the solution with column, the solvent was removed under vacuum condition and the entitled material was obtained in the form of pale yellowish viscous oil (110 g, 90.8% yield). $^1$H-NMR (CDCl$_3$) δ 0.57–1.20 (m, 8H, CH$_2$, CH$_3$), 1.42–1.58(t, 2H, CCH$_2$), 1.19–2.03(t, 2H, CCH$_2$), 2.35–2.44(t, 2H, CH$_2$CN), 7.32–7.73 (m, 8H, Aromatic).

Example 15

Synthesis of 2,7-diiodo-9-n-hexyl-9'-(2-cyanoethyl) fluorene (M-15)

In a 1 liter three-neck flask equipped with a mechanical stirrer, a thermometer and a reflux condenser, 100 g (0.33 mole) flux condenser, 100 g (0.33 mol)fluorene, 92.03 g (0.36 mol) of iodine and 91.28 g (0.4 mol) of ammoniumperoxidesulfate were dissolved in 600 ml of acetic acid, 30 ml of sulfuric acid water and 120 ml of water under nitrogen atmosphere. The resultant solution was stirred for twelve hours keeping the temperature at 80° C. When the reaction was finished, 20% of potassium hydroxide solution was added to the resultant solution and it was filtered, extracted using ether three times, washed by water several times and dried using anhydrous magnesium sulfate. Then the solvent was removed under vacuum condition and silica gel column was filtered using ethylacetate and hexane (1:2). The solvent was removed under vacuum condition and resultant material was re-crystallized using small amount of ethylacetate and excessive amount of hexane thus to obtain pale yellowish crystals. After filtering, the obtained crystals were fully dried in a vacuum oven maintained at a temperature of 30° C. to obtain 140 g (76.66% yield) of the entitled product. The melting point was 118 to 120° C. $^1$H-NMR (CDCl$_3$) δ 0.65–1.11 (m, 8H, CH$_2$, 3H, CH$_3$), 1.55–1.66 (t, 2H, CCH$_2$), 1.97–2.05 (t, 2H, CCH$_2$), 2.39–2.47 (t, 2H, CH$_2$CN), 7.52–7.80 (m, 6H, Aromatic).

Example 16

Synthesis of 2,7-diphenyl-9-n-hexyl-9'-(2-cyanoethyl) fluorene (M-16)

The procedure of Example 1 was repeated, except that 50 g (0.09 mol) of 2,7-diiodo-9-n-hexyl-9'-(2-cyanoethyl) fluorene was used. 32 g (78% yield) of the entitled product was obtained as a pure ivory-colored solid material having a melting point of 145 to 147° C. $^1$H-NMR (CDCl$_3$) δ 0.74–1.15 (m, 8H, CH$_2$, 3H, CH$_3$), 1.54–1.64 (t, 2H, CCH$_2$), 2.03–2.11 (t, 2H, CCH$_2$), 2.44–2.53 (t, 2H, CH$_2$CN), 7.34–7.81 (m, 16H, Aromatic).

Example 17

Synthesis of 2,7-bis(4-bromophenyl)-9-n-hexyl-9'-(2-cyanoethyl) fluorene (M-17)

The procedure of Example 2 was repeated, except that 20 g (0.043 mol) of 2,7-diphenyl-9-n-hexyl-9'-(ethyl-2-cyano) fluorene was used. 19.39 g (72% yield) of the entitled material was obtained as a white solid material. $^1$H-NMR (CDCl$_3$) δ 0.63–1.02 (m, 8H, CH$_2$, 3H, CH$_3$), 1.51–1.61 (t, 2H, CCH$_2$), 1.97–2.06 (t, 2, H CCH$_2$), 2.36–2.44 (t, 2H, CH$_2$CN), 7.44–7.73 (m, 14H, Aromatic).

Example 18

Synthesis of 2,7-bis[4-((trimethylsilyl)ethynyl)phenyl]-9-n-hexyl-9'-(2-cyanoethyl) fluorene (M-18)

The procedure of Example 3 was repeated, except that 19 g (0.03 mol) of 2,7-bis(4-bromophenyl)-9-n-hexyl-9'-(2-cyanoethyl) fluorene was used. 14.9 g (74% yield) of the entitled material having a melting point of 171 to 172° C. was obtained as a white solid material. $^1$H-NMR (CDCl$_3$) δ 0.31 (s, 2H, SiCH$_3$) 0.74–1.08 (m, 8H, CH$_2$, 3H, CH$_3$), 1.58–1.64 (t, 2H, CCH$_2$), 2.08–2.15 (t, 2H, CCH$_2$), 2.48–2.56 (t, 2H, CH$_2$CN), 7.42–7.83 (m, 14H, Aromatic).

Example 19

Synthesis of 2,7-bis(4-ethynylphenyl)-9-n-hexyl-9'-(2-cyanoethyl) fluorene (M-19)

The procedure of Example 4 was repeated, except that 10 g (5.2 mmol) of 2,7-bis[4-((trimethylsilyl)ethynyl)phenyl]-9-n-hexyl-9'-(2-cyanoethyl) fluorene was used. By a re-crystallization with a small amount of hexane and excess amount of ethanol, 6.5 g (83.9% yield) of the entitled material was obtained as a pale yellowish solid material. The melting point was 151 to 152° C. $^1$H-NMR (CDCl$_3$) δ 0.71–1.11 (m, 8H, CH$_2$, 3H, CH$_3$), 1.58–1.64 (t, 2H, CCH$_2$), 2.09–2.12 (t, 2H CCH$_2$), 2.49–2.58 (t, 2H, CH$_2$CN), 3.18(s, 2H, CH) 7.41–7.85(m, 14H, Aromatic).

Example 20

Synthesis of 2,7-bis[(trimethylsilyl)ethynyl]-9-n-hexyl-9'-(2-cyanoethyl) fluorene (M-20)

The procedure of Example 3 was repeated, except that 8 g (0.018 mol) of 2,7-diiodo-9-n-hexyl-9'-(2-cyanoethyl) fluorene was used. 8 g (89.6% yield) of the entitled product was obtained as a pale green solid material. The melting point was 69 to 70° C. $^1$H-NMR (CDCl$_3$) δ 0.26 (s, 2H, SiCh$^{a3}$), 0.40–1.01 (m, 8H, CH$_2$, 3H, CH$_3$), 1.40–1.55 (t, 2H, CCH$_2$), 1.92–2.0 (t, 2H, CCH$_2$), 2.33–2.40 (t, 2H, CH$_2$CN), 7.41–7.62 (m, 6H, Aromatic).

Example 21

Synthesis of 2,7-diethynyl-9-n-hexyl-9'-(2-cyanoethyl) fluorene (M-21)

The procedure of Example 4 was repeated, except that 5 g (0.01 mol) of 2,7-bis[(trimethylsilyl)ethynyl]-9-n-hexyl-9'-(2-cyanoethyl) fluorene was used. By a re-crystallization with a small amount of hexane and excess amount of ethanol, 3 g (84.7% yield) of the entitled product was obtained as a pale yellowish solid material. The melting point was 90 to 91° C. $^1$H-NMR (CDCl$_3$) δ 0.56–1.15 (m, 8H, CH$_2$, 3H, CH$_3$), 1.47–1.56 (t, 2H, CCH$_2$), 1.92–2.0 (t, 2H, CCH$_2$), 2.33–2.41 (t, 2H, CH$_2$CN), 3.17 (s, 2H, CH) 7.46–7.66 (m, 6H, Aromatic).

Example 22

Synthesis of 2,7-bis(4-bromo-2,5-di-hexyloxybenxene)-9,9'-di-normal-hexyl fluorene (M-22)

In a 1 liter three-neck flask equipped with a stirrer, a thermometer and a reflux condenser, 4 g (4.5 mmol) of 2,7-bis(2,5-di-hexyloxybenzyl)-9,9'-di-normal-hexyl fluorene was dissolved in 50 ml of methylene chloride and the resultant solution was cooled to −5° C. using ice water. 1.52 g (0.8 mol) of bromine which was diluted with 10 ml of methylene chloride was then slowly added dropwise into the resultant solution. After finishing the dropwise addition, the solution was stood to continue the reaction for 24 hours while the temperature was kept at 25° C. When the reaction was finished, 20% potassium hydroxide was poured to the resultant solution until red reaction liquid disappeared then after the organic layer was separated and it was washed by water several times. Then the resultant materials were dried using anhydrous magnesium sulfate. After filtering it, when the solvent was removed a viscous liquid was obtained. After dissolving the liquid in hexane, a solid was obtained by cooling down the same to −40° C. After re-crystallization twice using hexane, an ivory-colored crystal was obtained. The obtained crystals were filtered and dried in a vacuum oven maintained at a temperature of 30° C. The crystals weighed 3.9 g with a yield of 82% and the melting point thereof was 82 to 83° C. $^1$H-NMR (CDCl$_3$) δ 0.70–1.98 (m, 48H, CH$_2$, CH$_3$, CCH$_2$), 3.84–4.06(m, 8H, OCH$_2$), 7.18–7.62 (m, 10H, Aromatic).

Synthesis of Polymers

Example 23

Polymerization of 2,7-bis(4-ethynyl phenyl)-9,9'-di-n-hexyl fluorene (P-1)

1.0 g (1.8 mmol) of 2,7-bis(4-ethynyl phenyl)-9,9'-di-n-hexyl fluorene, 0.37 g (3.7 mmol) of cuprous chloride, 0.65 g (5.6 mmol) of N,N,N',N'-tetramethylethylene diamine, and 15 ml of chlorobenzene were charged into a 50 ml flask equipped with a stirrer, and the mixture was then reacted for 1 hour under a nitrogen atmosphere while bubbling oxygen. The resultant viscous reaction solution was added dropwise to a solution of 10 ml of 2.0N hydrochloric acid in 1 liter of methanol solution to precipitate out the polymer. The precipitated solid was filtered. The resultant filtrate weighed 0.90 g. $^1$H-NMR (CDCl$_3$) δ 0.7456–1.4315 (br, m, CH$_2$, CH$_3$), 2.01–2.17 (br, s, CCH$_2$), 7.42–7.778 (br, m, Aromatic).

Example 24

Polymerization of 2,7-bis(4-ethynyl phenyl)-9-n-hexyl-9'-(2-cyanoethyl) fluorene (P-2)

In a 50 ml-flask equipped with a stirrer, polymerization was carried out under a nitrogen atmosphere, in accordance with the method described in Example 23 using 1.0 g (1.9 mmol) of 2,7-bis(4-ethynyl phenyl)-9-n-hexyl-9'-(2-cyanoethyl) fluorene, to obtain 0.93 g of polymer. $^1$H-NMR (CDCl$_3$) δ 0.73–1.2 (br, m, CH$_2$, CH$_3$), 1.54–1.63 (br, s, CCH$_2$), 2.02–2.19 (br, s, CCH$_2$), 2.46–2.57 (br, s, CH$_2$CN), 7.41–7.85 (br, m, Aromatic).

Example 25

Polymerization of 2,7-bis(4-ethynyl phenyl)-9,9'-di-n-dodecyl fluorene (P-3)

In a 50 ml-flask equipped with a stirrer, polymerization was carried out under a nitrogen atmosphere, in accordance with the method described in Example 23 using 1.0 g (1.4 mmol) of 2,7-bis(4-ethynyl phenyl)-9,9'-di-n-dodecyl fluorene, to obtain 0.91 g of polymer. $^1$H-NMR (CDCl$_3$) δ 0.73–1.25 (br, m, CH$_2$, CH$_3$), 2.05–2.19 (br, s, CCH$_2$), 7.53–7.89 (br, m, Aromatic).

Example 26

Polymerization of 2,7-bis(4-ethynyl phenyl)-9,9'-di-n-hexadecyl fluorene (P-4)

In a 50 ml-flask equipped with a stirrer, polymerization was carried out under a nitrogen atmosphere, in accordance with the method described in Example 23 using 1.0 g (1.4 mmol) of 2,7-bis(4-ethynyl phenyl)-9,9'-di-n-hexadecyl fluorene, to obtain 0.92 g of polymer. $^1$H-NMR (CDCl$_3$) δ 0.64–1.29 (br, m, CH$_2$, CH$_3$), 1.97–2.06 (br, s, CCH$_2$), 7.37–7.79 (br, m, Aromatic).

Example 27

Copolymerization of 2,7-bis(4-ethynyl phenyl)-9,9'-di-n-dodecyl fluorene and 2,7-bis(4-ethynyl phenyl)-9-n-hexyl-9'-(2-cyanoethyl) fluorene (C-1)

In a 50 ml-flask equipped with a stirrer, copolymerization was carried out under a nitrogen atmosphere, in accordance with the same method described in Example 23 using 0.5 g (0.71 mmol) of 2,7-bis(4-ethynyl phenyl)-9,9'-di-n-dodecyl fluorene and 0.35 g (0.71 mmol) of 2,7-bis(4-ethynyl phenyl)-9-n-hexyl-9'-(ethyl-2-cyano) fluorene, to obtain 0.78 g of polymer. $^1$H-NMR (CDCl$_3$) δ 0.54–1.29 (br, m, CH$_3$ and CH$_2$), 1.46–1.79 (br, s, CCH$_2$), 1.91–2.25 (br, t, CCH$_2$), 2.47–2.69 (br, s, CH$_2$CN), 7.45–7.88 (br, m, Aromatic).

Example 28

Copolymerization of 2,7-bis(4-ethynyl phenyl)-9,9'-di-n-hexyl fluorene and 2,7-diethynyl-9,9'-di-n-hexyl fluorene (C-2)

In a 50 ml-flask equipped with a stirrer, copolymerization was carried out under a nitrogen atmosphere, in accordance with the same method described in Example 23 using 0.44 g (0.82 mmol) of 2,7-bis(4-ethynyl phenyl)-9,9'-di-n-hexyl fluorene and 0.3 g (0.78 mmol) of 2,7-diethynyl-9,9'-di-n-hexyl fluorene to obtain a precipitated solid material. The precipitated solid was filtered and dissolved in chloroform, and then re-precipitated in methanol to obtain a purified solid. Thereafter, the resultant solid was washed with methanol and then sufficiently dried in a vacuum oven at 40° C., thereby obtaining 0.66 g of a yellowish solid material. 1H-NMR (CDCl$_3$) δ 0.5–1.3 (br, m, CH$_3$ and CH$_2$), 1.8–2.2 (br, t, CCH$_2$), 7.3–7.8 (br, m, Aromatic).

Example 29

Copolymerization of 2,7-bis(4-ethynylphenyl)-9-n-hexyl-9'-(2-cyanoethyl) fluorene and 2,7-diethynyl-9,9'-n-hexyl fluorene (C-3)

Copolymerization was carried out in accordance with the same method described in Example 23 using 0.41 g (0.82 mmol) of 2,7-bis(4-ethynylphenyl)-9-n-hexyl-9'-(2-cyanoethyl) fluorene and 0.3 g (0.78 mmol) of 2,7-diethynyl-9,9'-n-hexyl fluorene to obtain a solid material. The extracted solid was filtered. The resultant filtrate was dissolved in chloroform, and then re-precipitated in methanol to obtain a purified solid. Thereafter, the resultant solid was washed with methanol and then completely dried in a vacuum oven at 40° C., thereby obtaining 0.65 g of a yellowish solid material. $^1$H-NMR (CDCl$_3$) δ 0.5–1.28 (br, m, CH$_3$ and CH$_2$), 1.4–1.7 (br, s, CCH$_2$), 1.8–2.2 (br, t, CCH$_2$), 2.4–2.6 (br, s, CH$_2$CN), 7.4–7.8 (br, m, Aromatic).

Example 30

Polymerization of 2,7-diethynyl-9-n-hexyl-9'-(2-cyanoethyl) fluorene (P-5)

Polymerization was carried out in accordance with the method described in Example 23 using 0.5 g (1.4 mmol) of 2,7-diethynyl-9-n-hexyl-9'-(2-cyanoethyl) fluorene to pre-cipite a solid material. The precipitated solid was filtered and dissolved in chloroform, and then re-precipitated in methanol to obtain a purified solid. Thereafter, the resultant solid was washed with methanol and then sufficiently dried in a vacuum oven at 40° C., thereby obtaining 0.42 g of a yellowish solid material. 1H-NMR (CDCl$_3$) δ0.5–1.2 (br, m, CH$_3$ and CH$_2$), 1.39–1.68 (br, s, CCH$_2$), 1.8–2.15 (br, s, CCH$_2$), 2.24–2.57 (br, s, CH$_2$CN), 7.4–7.82 (br, m, Aromatic).

Example 31

Copolymerization of 2,7-bis(4-ethynyl phenyl)-9,9'-di-n-hexyl fluorene and 2,7-dibromo-9,9'-di-n-hexyl fluorene (C-4)

In a 250 ml flask equipped with a stirrer and a thermometer, 0.49 (0.75 mmol) of 2,7-bis(4-ethynyl phenyl)-9,9'-di-n-hexyl fluorene, and 0.37 g (0.75 mmol) of 2,7-dibromo-9,9'-di-n-hexyl fluorene were dissolved in 50 ml of toluene and 35 mg (0.03 mmol) of tetrakistriphenylphosphine palladium, 24 mg (0.15 mmol) of bromobenzene, 5.7 mg (0.03 mmol) of cuprous iodide and 50 ml of diisopropylamine were added to the solution. With a reflux meter, the temperature was raised to 70° C. and the mixture was then reacted for twelve hours. The resultant viscous reaction solution was slowly added dropwise to 1 liter of methanol solution containing 10 ml of 2.0N hydrochloric acid to cause solids to precipitate out. The precipitated solid was filtered. The resultant filtrate was dissolved in chloroform, and then re-precipitated in methanol to obtain a purified solid. Thereafter, the resultant solid was washed with methanol and then completely dried in a vacuum oven at 40° C., thereby obtaining 0.65 g of a yellowish solid.

Example 32

Copolymerization of 1 g (1.5 mmol) of 2,7-bis(4-bromophenyl)-9,9'-n-hexyl fluorene and para-di-vinyl benzene (C-5)

1 g (1.5 mmol) of 2,7-bis(4-bromophenyl)-9,9'-n-hexyl fluorene and 0.21 g (1.6 mmol) of para-di-vinyl benzene were dissolved in 30 ml of DMF and 13.5 mg of palladiumII acetate and 18.3 mmol of tri-ortho-tolylphosphine were added to the solution. The mixture was then circulated for twenty four hours at 100° C. The resultant viscous reaction solution was slowly added dropwise to 1 liter of methanol containing a solution of 10 ml of 2.0N hydrochloric acid to cause solids to precipitate out. The precipitated solid was filtered. The resultant filtrate was dissolved in chloroform, and then re-precipitated in methanol to obtain a purified solid. Thereafter, the resultant solid was washed with methanol and then completely dried in a vacuum oven at 40° C., thereby obtaining 0.78 g of a yellowish polymer.

Example 33

Polymerization of 2,7-bis(4-bromophenyl)-9,9'-di-n-hexyl fluorene (P-6)

1 g (1.23 mmol) of 2,7-bis(4-bromophenyl)-9,9'-di-n-dodecyl fluorene, 15 mg (0.123 mmol) of nickel II chloride, 0.26 g (0.98 mmol) of triphenylphosphine, 0.24 g (0.123 mmol) of zinc and 0.26 g (0.123 mmol) of 2,2'-bipyridyl were charged into a 50 ml flask equipped with a stirrer and a thermometer while a nitrogen purging state was maintained around 20~30 minutes. Then 10 ml of 1-methyl-2-pyrolidone (NMP) was added to the mixture using an injector and the temperature was kept at 85 to 90° C. The mixture was then reacted for 48 hours. The resultant dark brown viscous reaction solution was slowly added dropwise to 1 liter of methanol containing a solution of 10 ml of 2.0N hydrochloric acid to cause solids to precipitate out. The precipitated solid was filtered. The resultant filtrate was dissolved in chloroform, and then re-precipitated in methanol to obtain a purified solid. Thereafter, the resultant solid was washed with methanol and then completely dried in a vacuum oven at 40° C., thereby obtaining 0.75 g of a pale yellowish polymer.

Example 34

Figure 1:
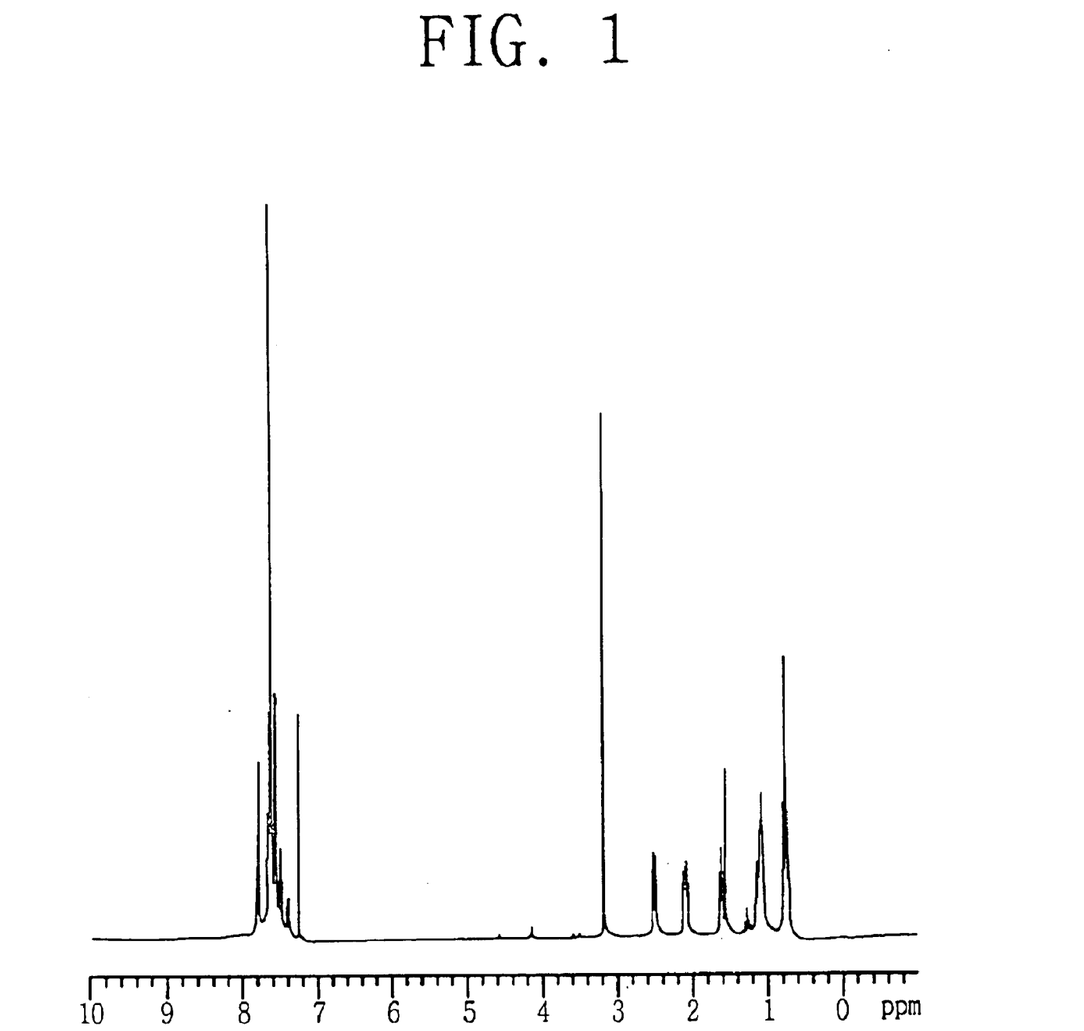
FIG. 1 is a $^1$H-NMR spectrum of a monomer M-19 of Example 19.
Figure 2:
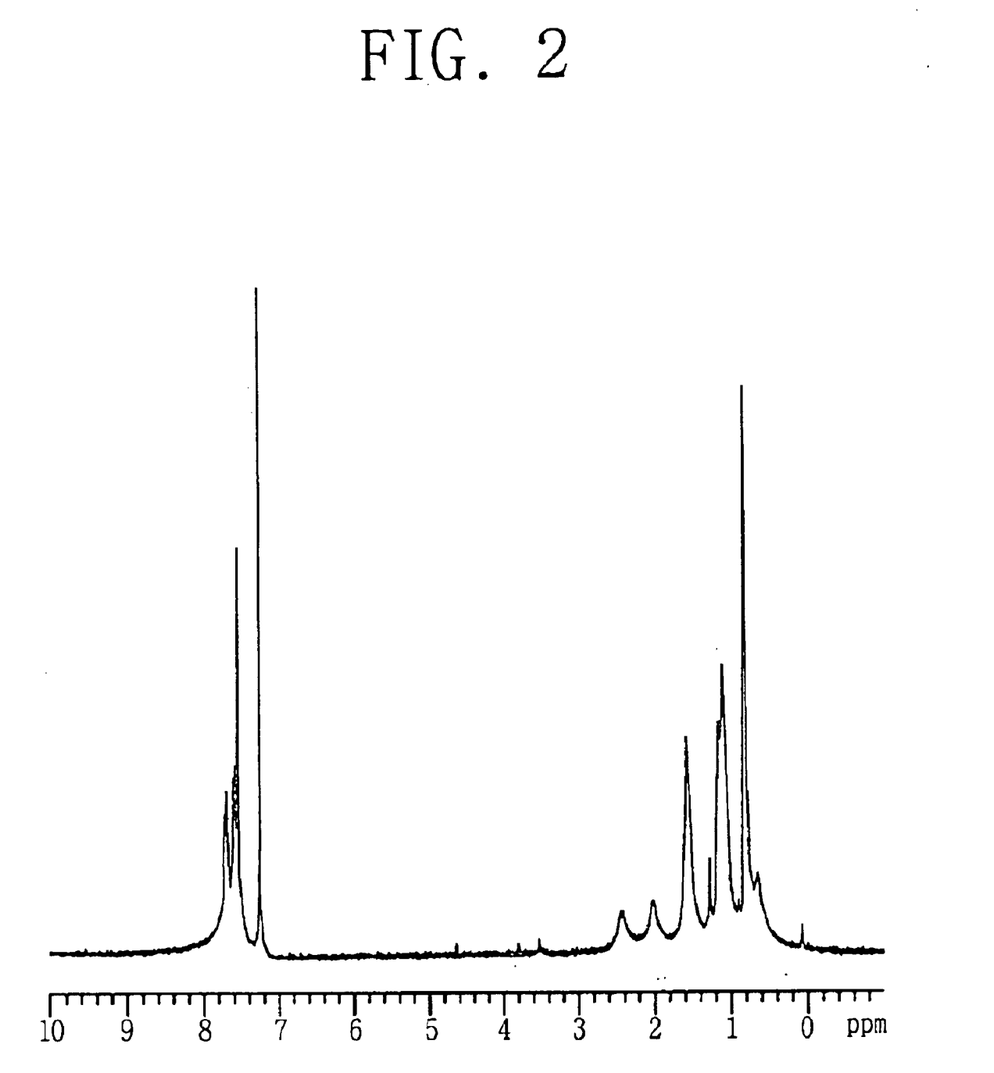
FIG. 2 is a $^1$H-NMR spectrum of a copolymer C-3 of Example 29.
Figure 3:
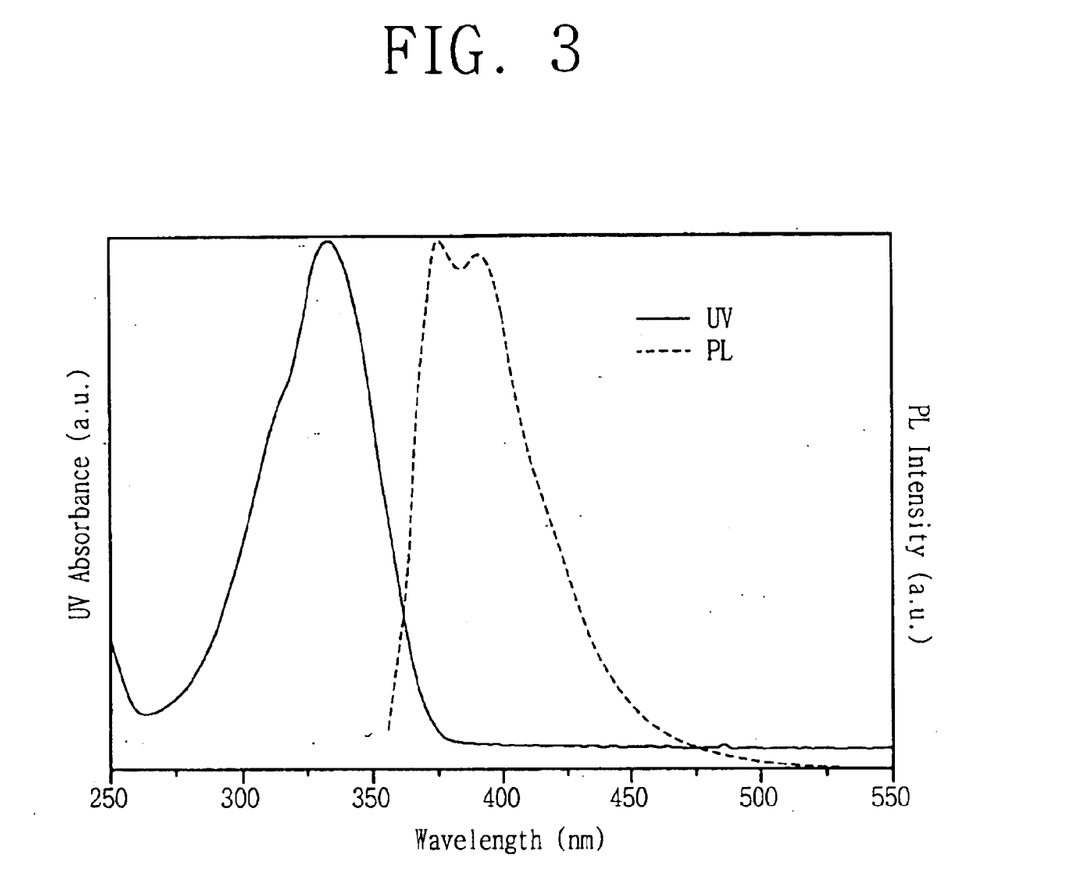
FIG. 3 is a UV-VIS and PL spectrum of a monomer M-19 of Example 19.
Figure 4:
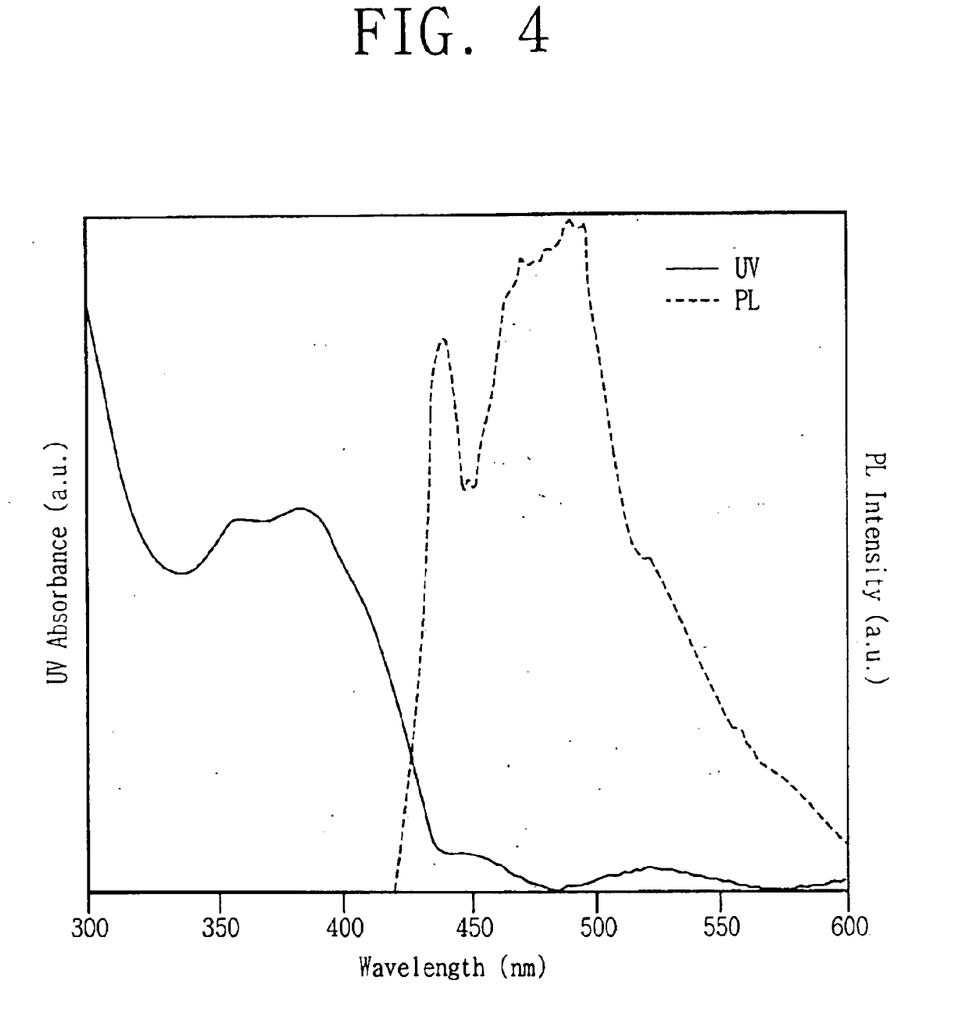
FIG. 4 is a UV-VIS and PL spectrum of a copolymer C-3 of Example 29 (a film)

Structural Analysis, Ultraviolet Ray, Photoluminescence and Electroluminescence Characteristics FIGS. 1 and 2 show monomers prepared in accordance with the above Examples 19 and 29 and $^1$H NMR spectrum of copolymer (C-3). FIG. 3 shows ultraviolet-visible (UV-Vis) and photoluminescence (PL) spectra of representative monomers prepared in accordance with the above Example 19 (M-19). Formation of the polymeric thin film was accomplished by dissolving 0.1 g of the copolymer (C-3) in 5 ml of chloroform, purifying the resultant solution using a 0.2 micron filter, and then performing a spin coating while controlling the spin speed (usually, 900 to 1,200 rpm) such that a thin film having a thickness of about 100 nm was formed. After being dried at the room temperature, the coated sample was measured for the UV spectrum, and then for the PL spectrum using a wavelength of the maximum UV peak value. Results obtained are shown in FIG. 4.

Figure 5:
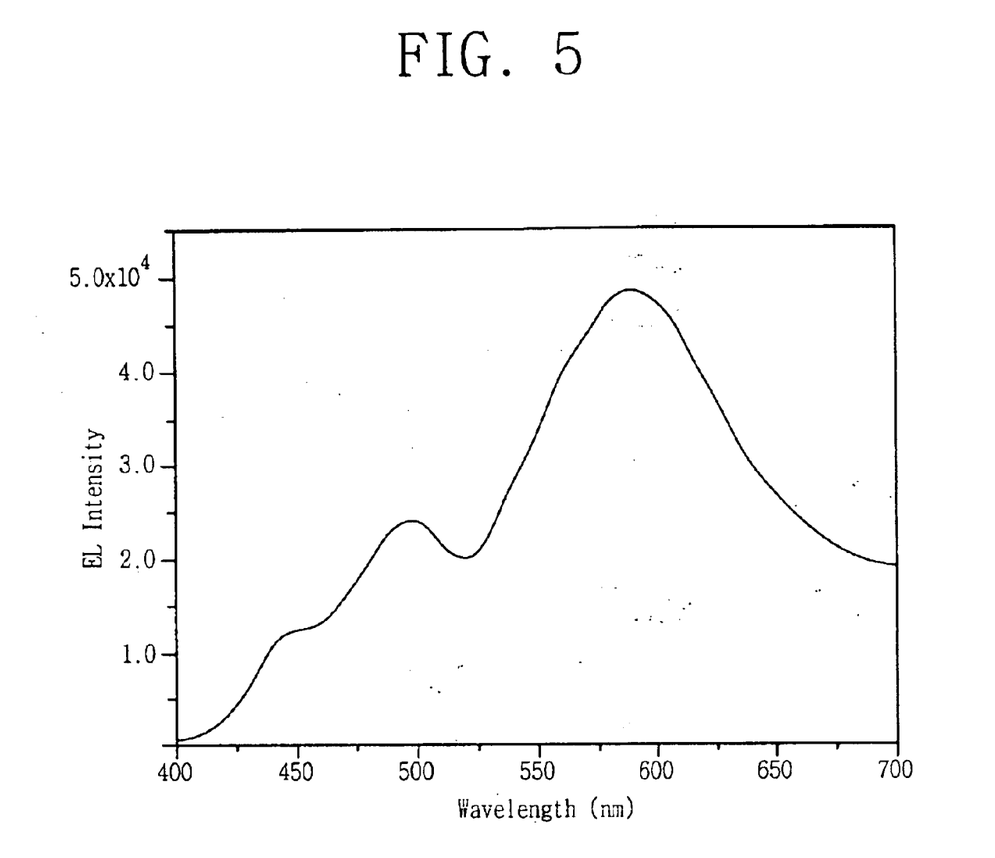
FIG. 5 is an EL spectrum of a copolymer C-3 of Example 29.
Figure 6:
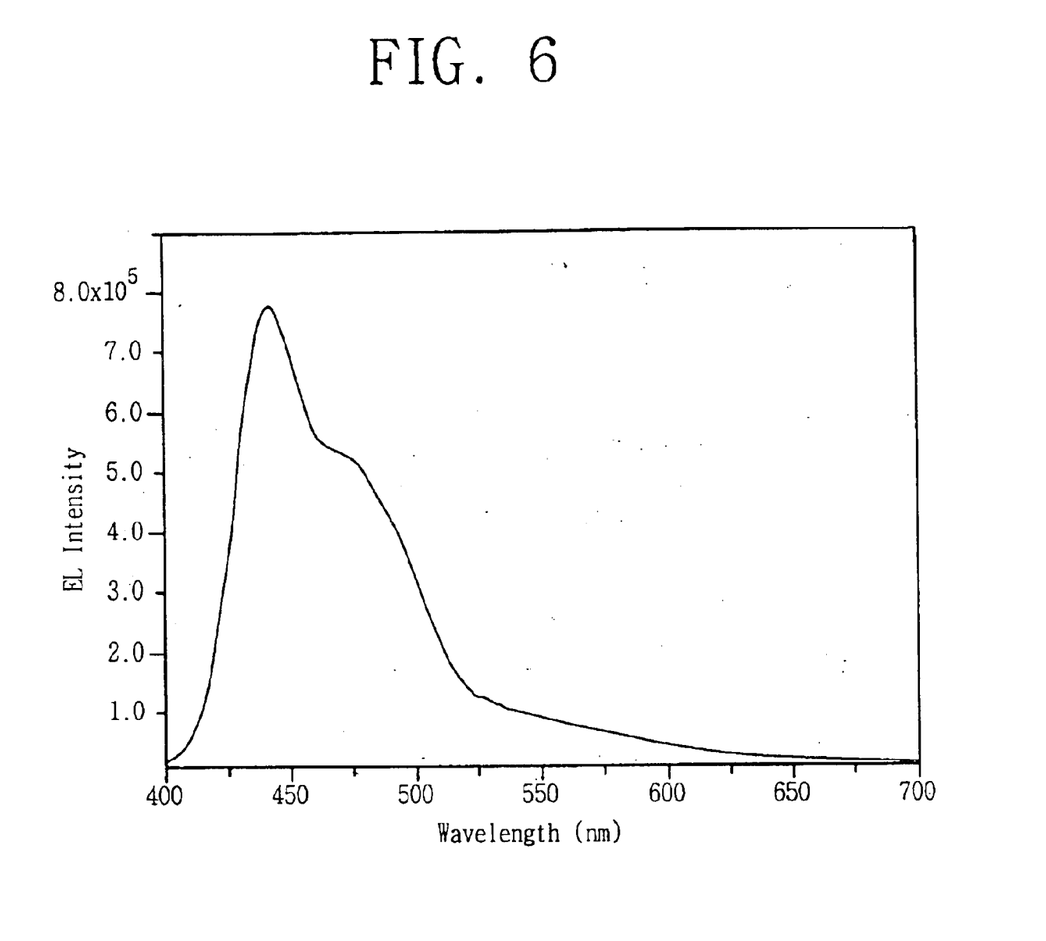
FIG. 6 is an EL spectrum of a copolymer C-3 of Example 29 which is blended with polyvinylcarbazole (polyvinylcarbazole/C-3=8:2).

Meanwhile, EL characteristics were determined using an EL device which has a typical structure, namely, an ITO/luminescent layer/electrode structure. In this case, the luminescent layer may be made of the polymers manufactured according to the Examples, or that obtained by blending an aformentioned macromolecules for general such as use polyvinylcarbazole, polymethylmethacrylate, polystyrene, and epoxy resin, etc., with the polymers of the present invention, in the presence of a chloroform solvent. For the material for the electrodes, aluminum was selected. The EL device was fabricated by vacuum depositing an aluminum on a luminescent layer which was spin coated with 100 nm thickness on an ITO glass plate, in accordance with a vacuum deposition method, as in the sample manufacturing method used to prepare samples for the measurement of UV or PL spectrum. The representative EL spectrum results of the copolymer (C-3) alone and as blended with polyvinylcarbazole are shown in FIG. 5 and FIG. 6, respectively.

Industrial Applicability

The polymer of the present invention can be used as a photoluminescence material for emitting layer. Namely, the polymer of the present invention can be used for EL devices containing anode/luminescent layer/cathode. If necessary, there may be further added a transfer layer and/or a reflecting layer. The polymer of the present invention can be easily blended with other polymeric materials to enhance the photoluminescent efficiency. It is also expected that the present invention can be used as a information delivery material besides the illuminants hereafter.

What is claimed is:

1. A fluorene-based polymer of the following Formula (I):

Formula (I)

wherein, $R_1$ and $R_2$ are the same or different and each represent hydrogen, an aliphatic or alicyclic alkyl or alkoxy group containing from 1 to 22 carbon atoms, aryl or aryloxy group containing 6 to 18 carbon atoms, cyano, cyanoethyl, or alkyl or aryl derivative of silicon, tin or germanium;

$R_3$ and $R_4$ are the same or different and each represent an aliphatic or alicyclic alkyl or alkoxy group containing from 1 to 22 carbon atoms, aryl or aryloxy group containing 6 to 18 carbon atoms, cyano, cyanoethyl, or alkyl or aryl derivative of silicon, tin or germanium;

wherein X is a member selected from the group consisting of

Ar is a member selected from the group consisting of substituted phenylene, biphenylene, fluorene, terphenylene, naphthalene, anthracene, phenanthrene, pyridine, furan, thiophene, pyrrole, dibenzofuran, dibenzothiophene, diphenyloxadiazole, stilbene, diphenyithiadiazole, carbazole, diphenylmethane, bisphenoxyalkane, bisphenoxyalkoxy, and substituted derivatives thereof; and n is an integer equal to or greater than 1.

2. The fluorene-based polymer of claim 1, wherein n is an integer from 1 to 1,000.

3. The fluorene-based polymer of claim 1, wherein $R_1$ or $R_2$ is selected from the group consisting of hydrogen, methyl, ethyl, propyl, isopropyl, butyl, isobutyl, pentyl hexyl, ethylhexyl, heptyl, octyl, isooctyl, nonyl, decyl, dodecyl, hexadecyl, octadecyl, docosyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl, anthracene, cyano or cyanoethyl, trimethylsilyl, triphenylsilyl, tributyltin, or triethylgermanium.

4. The fluorene-based polymer of claim 1, wherein Ar is a member selected from the group consisting of:

wherein the $R_1$ and $R_2$ substituents of Ar are the same or different and each represent an aliphatic or alicyclic alkyl or alkoxy group containing from 1 to 22 carbon atoms, aryl or aryloxy group containing 6 to 18 carbon atoms, cyanoethyl, or alkyl or aryl derivative of silicon, tin or germanium.

5. A copolymer comprising two different repeat units having Formula I according to claim 1.

6. An electroluminescent device comprising an anode, a cathode, and an intermediate luminescent layer comprising a fluorene-based polymer according to any one of claims 1 to 5.

7. The electroluminescent device of claim 6, dditionally having a hole transfer layer between a luminescent layer and an anode.

8. The electroluminescent device of claim 6, wherein the luminescent layer is cross-linked by heat and/or light.

9. The electroluminescent device of claim 6, wherein the luminescent layer is made of a blend of the fluorene-based polymer and a polymer for general use selected from the group consisting of polyvinylcarbazole, polymethylmethacrylate, polyacrylate, polystyrene, polycarbonate, polyvinylchloride, polyethylene, polypropylene, polyacrylonitrile, polyvinylpyrrolidone, polyvinylalcohol, polyvinylacetate, polyvinylbutyral, polyvinylamine, polycaprolactone, polyethyleneterephthalate, polybutyleneterephthalate, polyurethane, acrylonitrilestyrenebutadiene (ABS), polysulfone, or polyvinylfluoride, acetal, polyamide, polyimide, polyester, alkyd resin, urea resin, furan resin, nylon resin, melamine resin, phenol resin, silicone resin, and epoxy resin.

10. The electroluminescent device of claim 9, wherein the weight ratio of the polymer for general use to fluorene-based polymer of Formula 1 is 0.1 to 99.9:1.

11. A fluorene-based polymer selected from the group consisting of poly-2,7-bis(4-ethynylphenyl)-9,9'-di-n-hexylfluorene, poly-2,7-bis(4-ethynylphenyl)-9-n-hexyl-9'-(2-cyanoethyl)fluorene, poly-2,7-bis(4-ethynylphenyl)-9,9'-di-n-dodecylfluorene, poly-2,7-bis(4-ethynylphenyl)-9,9'-di-n-hexadecylfluorene, and poly-2,7-diethynyl-9-n-hexyl-9'-(2-cyanoethyl)fluorene.

12. A fluorene-based copolymer selected from the group consisting of a copolymer of 2,7-bis(4-ethynylphenyl)-9,9'-di-n-dodecylfluorene and 2,7-bis(4-ethynylphenyl)-9-n-hexyl-9'-(2-cyanoethyl)fluorene, a copolymer of 2,7-bis(4-ethynylphenyl)-9,9'-di-n-hexylfluorene and 2,7-diethynyl-9,9'-n-hexylfluorene, a copolymer of 2,7-bis 4-ethynylphenyl)-9-n-hexyl-9 '-(2-cyanoethyl)fluorene and 2,7-diethynyl-9,9'-di-n-hexylfluorene, and a copolymer of 2,7-bis(4-ethynylphenyl)-9,9'-di-n-hexylfluorene and 2,7-dibromo 9,9 '-di-n-hexycfluorene.

* * * * *